(12) United States Patent
Dor et al.

(10) Patent No.: US 11,942,965 B1
(45) Date of Patent: Mar. 26, 2024

(54) SOFT REED-SOLOMON DECODER FOR A NON-VOLATILE MEMORY

(71) Applicant: SAMSUNG ELECTRONICS CO., LTD., Suwon-si (KR)

(72) Inventors: Avner Dor, Kfar Saba (IL); Yaron Shany, Kfar Saba (IL); Ariel Doubchak, Herzliya (IL); Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/045,576

(22) Filed: Oct. 11, 2022

(51) Int. Cl.
| | | |
|---|---|---|
| G06F 11/10 | (2006.01) | |
| G06F 11/07 | (2006.01) | |
| G06F 11/30 | (2006.01) | |
| G06F 13/16 | (2006.01) | |
| G06F 13/28 | (2006.01) | |
| H03M 13/11 | (2006.01) | |
| H03M 13/15 | (2006.01) | |

(52) U.S. Cl.
CPC .... *H03M 13/1575* (2013.01); *H03M 13/1111* (2013.01); *H03M 13/1545* (2013.01)

(58) Field of Classification Search
CPC .......... H03M 13/1545; H03M 13/1111; H03M 13/1575
See application file for complete search history.

(56) References Cited

U.S. PATENT DOCUMENTS

| | | | | |
|---|---|---|---|---|
| 6,131,178 A | * | 10/2000 | Fujita ................ | H03M 13/1535 714/784 |
| 6,449,746 B1 | * | 9/2002 | Truong ............... | H03M 13/154 714/784 |
| 6,643,819 B1 | * | 11/2003 | Weng .................... | H03M 13/15 714/784 |
| 7,392,454 B2 | * | 6/2008 | Piret ................... | H03M 13/132 714/752 |
| 2008/0144833 A1 | * | 6/2008 | Matsumoto ........ | H03M 13/1151 380/278 |

OTHER PUBLICATIONS

Ron M. Roth, "Introduction to coding theory", Cambridge university press. 2006.

(Continued)

*Primary Examiner* — Guy J Lamarre
(74) *Attorney, Agent, or Firm* — F. Chau & Associates, LLC

(57) ABSTRACT

A soft-decision decoding computes a first syndrome polynomial in accordance with a received word, computes a second syndrome polynomial by multiplying the first syndrome polynomial by a locator polynomial based on locations of erasures within the received word, finds a basis and private solution to an affine space of polynomials that solve key equations based on the second syndrome polynomial, determines a weak set of a locations of symbols in the received word with confidence below a certain confidence level, computes a matrix from the basis, the private solution and the weak set, determines sub-matrices in the matrix whose rank is equal to a rank of the matrix, determines error locator polynomial (ELP) candidates from the sub-matrices, the basis, and the private solution, and corrects the received word using a selected one of the ELP candidates.

20 Claims, 17 Drawing Sheets

(56) References Cited

OTHER PUBLICATIONS

Georg Schmidt et al., "Collaborative Decoding of Interleaved Reed-Solomon Codes and Concatenated Code Designs", IEEE 2006.
R. J. McEliece, "The Guruswami-Sudan Decoding Algorithm for Reed-Solomon Codes" May 15, 2003.
Georg Schmidt, "Decoding Reed-Solomon codes beyond half the minimum distance using shift-register synthesis," in Proc. IEEE Intern. Symposium on Inf. Theory, (Seattle, WA, USA), pp. 459-463, Jul. 2006.
Yingquan Wu, "New List Decoding Algorithms for Reed-Solomon and BCH Codes" IEEE Transactions on Information Theory, vol. 54, No. 8, Aug. 2008.
D. Chase, "A Class of Algorithms for Decoding Block Codes with Channel Measurement" Information IEEE Trans. Inform. Theory, pp. 170-181, Jan. 1972.
Xinmiao Zhang, Jiangli Zhu, Yingquan Wu, "Efficient One-Pass Chase Soft-Decision BCH Decoder for Multi-Level Cell NAND Flash Memory" Published 2011 Computer Science 2011 IEEE.
Iliya Bouyuklieva, and Valentin Bakoevb, "A method for efficiently computing the number of codewords of fixed weights in linear codes" Discrete Applied Mathematics, vol. 156, Issue 15, Aug. 6, 2008, pp. 2986-3004.
Zeev Dvir et al., "Extensions to the Method of Multiplicities, with applications to Kakeya Sets and Mergers" arXiv:0901.2529v2 [math. CO] May 13, 2009.
G. H. Norton, "On the complexity of finding shortest linear recurrences" 2002.

\* cited by examiner

FIG. 7

Initialization:

$\sigma_0(x) = 1, \omega_0(x) = 0, \mu = 0$

Algorithm:

for $i = 0$; $(2 \cdot t)$ $\delta_i = coefficient\ of\ x^i\ of\ the\ polynomial\ \sigma_i(x) \cdot S(x)$ $\sigma_{i+1}(x) = \sigma_i(x) - \frac{\delta_i}{\delta_\mu} \cdot x^{i-\mu} \cdot \sigma_\mu(x)$, [here $\mu = \mu(i)$]

$\omega_{i+1}(x) = \omega_i(x) - \frac{\delta_i}{\delta_\mu} \cdot x^{i-\mu} \cdot \omega_\mu(x)$ If $(\delta_i \neq 0)$ and $(2 \cdot o(\sigma_i(x), \omega_i(x)) \leq i)$ $\mu \leftarrow i$, [i.e. set: $\underline{\mu = \mu(i+1) = i}$, next $\mu$ is determined here]

Where $o(\sigma(x), \omega(x))$ is defined as the "order" as follow:

$o(\sigma(x), \omega(x)) = \max(\deg(\sigma(x)), \deg(\omega(x)) + 1)$

FIG. 8

$L = [\,]$ [Start with empty list]

for $i = 1:n$ if $\lambda(\alpha_i^{-1}) = 0$ $L = [L, i]$ if $length(L) = deg(\lambda(x))$ $ELP_{final\_candidate}(x) = \lambda(x)$

FIG. 9

(1) $\lambda(x) \cdot S(x) = \gamma(x) \, mod(x^{2t})$ (2) $\lambda(0) = 1$ (3) $\deg(\gamma(x)) < \deg(\lambda(x)) = t + r$ (4) $\gcd(\lambda(x), \gamma(x)) = 1$ (5) The number of distinct roots of $\lambda(x)$ is $t+r$.

(6) The number of roots that $\lambda(x)$ has in $W$ is at least $2r+1$.

FIG. 10

$$[\gamma_0, \gamma_1, \gamma_2, \ldots, \gamma_{t+r-1}, 0, 0, 0, 0] = [\lambda_0, \lambda_1, \lambda_2, \ldots, \ldots, \ldots, \ldots, \lambda_{t+r}] \begin{bmatrix} S_0 & S_1 & S_2 & \cdots & S_{t+r} & S_{t+r+1} & S_{t+r+2} & \cdots & S_{2t-1} \\ 0 & S_0 & S_1 & \cdots & S_{t+r-1} & S_{t+r} & S_{t+r+1} & \cdots & S_{2t-2} \\ 0 & 0 & S_0 & \cdots & S_{t+r-2} & S_{t+r-1} & S_{t+r} & \cdots & S_{2t-3} \\ \vdots & \vdots & \vdots & \cdots & \vdots & \vdots & \vdots & \cdots & \vdots \\ 0 & 0 & 0 & \cdots & S_2 & S_3 & S_4 & \cdots & S_{t-r+1} \\ 0 & 0 & 0 & \cdots & S_1 & S_2 & S_3 & \cdots & S_{t-r} \\ 0 & 0 & 0 & \cdots & S_0 & S_1 & S_2 & \cdots & S_{t-r-1} \end{bmatrix}$$

```
i = 0
for j = 1:(t + r)
    if   o(σ_{2t-j}(x), ω_{2t-j}(x)) ≤ t + r - j
        i = i + 1
        λ_i(x) = x^j · σ_{2t-j}(x)
```

FIG. 13

$$A \equiv \begin{bmatrix} \lambda_1(\alpha_{i_{1}}^{-1}) & \lambda_2(\alpha_{i_{1}}^{-1}) & \lambda_3(\alpha_{i_{1}}^{-1}) & \cdots & \lambda_{2r}(\alpha_{i_{1}}^{-1}) & \lambda_{2r+1}(\alpha_{i_{1}}^{-1}) \\ \lambda_1(\alpha_{i_{2}}^{-1}) & \lambda_2(\alpha_{i_{2}}^{-1}) & \lambda_2(\alpha_{i_{2}}^{-1}) & \cdots & \lambda_{2r}(\alpha_{i_{2}}^{-1}) & \lambda_{2r+1}(\alpha_{i_{2}}^{-1}) \\ \vdots & \vdots & \vdots & \vdots & \vdots & \vdots \\ \lambda_1(\alpha_{i_{|W|}}^{-1}) & \lambda_2(\alpha_{i_{|W|}}^{-1}) & \lambda_2(\alpha_{i_{|W|}}^{-1}) & \cdots & \lambda_{2r}(\alpha_{i_{|W|}}^{-1}) & \lambda_{2r+1}(\alpha_{i_{|W|}}^{-1}) \end{bmatrix}$$

(a)

$$\begin{bmatrix} \lambda_1(\alpha_{i_{p_1}}^{-1}) & \lambda_2(\alpha_{i_{p_1}}^{-1}) & \lambda_3(\alpha_{i_{p_1}}^{-1}) & \cdots & \lambda_{2r}(\alpha_{i_{p_1}}^{-1}) & \lambda_p(\alpha_{i_{p_1}}^{-1}) \\ \lambda_1(\alpha_{i_{p_2}}^{-1}) & \lambda_2(\alpha_{i_{p_2}}^{-1}) & \lambda_2(\alpha_{i_{p_2}}^{-1}) & \cdots & \lambda_{2r}(\alpha_{i_{p_2}}^{-1}) & \lambda_{2r}(\alpha_{i_{p_2}}^{-1}) \\ \vdots & \vdots & \vdots & \cdots & \vdots & \vdots \\ \lambda_1(\alpha_{i_{p_{2r+1}}}^{-1}) & \lambda_2(\alpha_{i_{p_{2r+1}}}^{-1}) & \lambda_2(\alpha_{i_{p_{2r+1}}}^{-1}) & \cdots & \lambda_{2r}(\alpha_{i_{p_{2r+1}}}^{-1}) & \lambda_{2r}(\alpha_{i_{p_{2r+1}}}^{-1}) \end{bmatrix} \begin{bmatrix} g_1 \\ g_2 \\ g_3 \\ \vdots \\ g_{2r} \\ 1 \end{bmatrix} = \begin{bmatrix} 0 \\ 0 \\ 0 \\ \vdots \\ 0 \end{bmatrix}$$

Let $A=(a_{i,j})_{1\leq i\leq M, 1\leq j\leq N}$ be a M×N matrix in RRE form. We may assume without loss of generality that A has no zero rows. Denote by $v_i$ the j row of A. Let B the matrix obtained from A by adding an arbitrary row, v, at the bottom of A.

For every j row of A let j(i) be the coordinate of the leading one of the j row.
Write $v=[a_{M+1,1}, \ldots, a_{M+1,N}]$

Step 1. For i=1:M $$v := v - a_{M+1,j(i)} \cdot v_i$$

The resulting v has zero at every entry j(i), for i=1,...,M. At this point if v=0 then the procedure ends with output matrix C is equal to A with a zero row added at its bottom.

Otherwise proceed as follows.

FIG. 14B

Step 2. Normalize v so that its leading coefficient is 1.

Let j* be the coordinate of the leading one of v. It then holds that j*≠j(i) for all i∈[M].

Next we modify A by adding a product of v to the i (i=1,...,M) row of A such that it will have zero in the j* coordinate. Thus we do the following step 3:

Step 3. For i=1:M $$v_i = v_i - a_{i,j^*} \cdot v$$

The resulting matrix -- without the added bottom row v - will be called A'. The j* column of A' is zero. Put j(0)=0. Let i* be maximal such that J(i*)<j*.

Step 4. Insert the row v into the matrix A' just below the i* row.

The (final) resulting matrix, called C, is RRE.

SOFT REED-SOLOMON DECODER FOR A NON-VOLATILE MEMORY

TECHNICAL FIELD

Exemplary embodiments of the present inventive concept relate to Reed-Solomon (RS) codes and more particularly to an RS decoder for a non-volatile memory.

DISCUSSION OF RELATED ART

A non-volatile memory is a type of computer memory that can retain stored information even after power is removed. Flash memory is an example of non-volatile memory. A non-volatile memory system typically includes a memory controller and a non-volatile memory (NVM).

Data may be encoded using an error correction code (ECC) and stored in the NVM in such a way that a decoder can identify and correct errors in the data. For example, the decoder may be present in an ECC circuit of the memory controller. Typically, data strings are encoded by adding a number of redundant bits to them. When the original data is reconstructed, the decoder examines the encoded message to check for any errors. A string of bits with the added redundancy is referred to as called code-word (CW).

Reed-Solomon (RS) codes are a group of ECC codes that operate on a block of data treated as finite-field elements called symbols. RS codes are able to detect and correct multiple symbol errors. However, current RS decoders use a large amount of power and take up a lot of area when the number of errors exceeds the subsequent HD bound.

SUMMARY

According to an exemplary embodiment of the inventive concept, a memory system including a memory device and a decoder is provided. The decoder is configured to perform a soft-decision decoding by computing a first syndrome polynomial in accordance with a received word, computing a second syndrome polynomial by multiplying the first syndrome polynomial by a locator polynomial based on locations of erasures within the received word, finding a basis and private solution to an affine space of polynomials that solve key equations based on the second syndrome polynomial, determining a weak set of a locations of symbols in the received word with confidence below a certain confidence level, computing a matrix A from the basis, the private solution and the weak set, determining sub-matrices in the matrix A whose rank is equal to a rank of the matrix A, determining error locator polynomial (ELP) candidates from the sub-matrices, the basis, and the private solution, and correcting the received word using a selected one of the ELP candidates to generate corrected data.

The selected ELP candidate may be determined by performing a Chien search on the ELP candidates or by performing Gaussian elimination operations on subsets of rows of the matrix A, where computation sharing is frequently used. The selected ELP candidate may be determined by processing and storing a plurality of matrices in temporary storage, where each of the matrices have a first property that all rows consisting of only zeroes are at the bottom, a second property that a leading coefficient of a non-zero row is always strictly to the right of a leading coefficient of a row above the non-zero row, a third property that a leading entry in each non-zero row is a one and referred to as a leading 1, a fourth property that each column containing the leading 1 has zeros in all its other entries, and a fifth property that a linear space spanned by its rows is equal to a linear space spanned by a subset of rows of the matrix A. The selected ELP candidate may be determined by performing an iterative process, where an input of each iteration of the iterative process comprises a matrix B with the five properties and a row v of the matrix A, and wherein said iteration comprises Gaussian elimination operations that are performed on matrix B and v, and wherein an output of said iteration comprises a matrix with the five properties, whose rows span the linear space that is equal to the linear space spanned by the rows of B and v. A depth first tree may be used to determine B and v.

According to an exemplary embodiment of the inventive concept, a computer-implemented method for decoding a received word is provided. The method includes: computing a first syndrome polynomial in accordance with the received word; computing a second syndrome polynomial by multiplying the first syndrome polynomial by a locator polynomial based on locations of erasures within the received word; finding a basis and private solution to an affine space of polynomials that solve key equations based on the second syndrome polynomial; determining a weak set of a locations of symbols in the received word with confidence below a certain confidence level; computing a matrix from the basis, the private solution and the weak set; determining sub-matrices in the matrix whose rank is equal to a rank of the matrix; determining error locator polynomial (ELP) candidates from the sub-matrices, the basis, and the private solution; and correcting the received word using a selected one of the ELP candidates.

According to an exemplary embodiment of the inventive concept, a computer program product is provided to perform a decoding on a received word. The computer program product includes a computer readable storage medium having program instructions embodied therewith and the program instructions are executable by a computer to perform a method. The method includes: computing, by a computer program of the computer program product, a first syndrome polynomial in accordance with the received word; computing, by the computer program, a second syndrome polynomial by multiplying the first syndrome polynomial by a locator polynomial based on locations of erasures within the received; finding, by the computer program, a basis and private solution to an affine space of polynomials that solve key equations based on the second syndrome polynomial; determining, by the computer program, a weak set of a locations of symbols in the received word with confidence below a certain confidence level; computing, by the computer program, a matrix from the basis, the private solution and the weak set; determining, by the computer program, sub-matrices in the matrix whose rank is equal to a rank of the matrix; and determining, by the computer program, an error locator polynomial (ELP) from the sub-matrices, the basis, and the private solution, for correcting the received word.

BRIEF DESCRIPTION OF THE DRAWINGS

The above and other features of the present inventive concept will become more apparent by describing in detail exemplary embodiments thereof with reference to the accompanying drawings, in which:

FIG. 7 illustrates a BM algorithm that may be used in the encoder;

FIG. 8 illustrates a method of determining an Error Location Polynomial (ELP) that may be used in the encoder;

FIG. 9 illustrates conditions satisfied by a valid ELP and an error evaluator polynomial (ELP) pair that usable by the encoder to correct a codeword;

FIG. 10 illustrates an exemplary matrix that may be generated by the encoder during a hard-decision decoding;

FIG. 13 illustrates an exemplary matrix that may be generated by the encoder during a soft-decision decoding;

FIG. 14A and FIG. 14B illustrate a procedure to convert a matrix into Reduced Row Echelon (RRE) during the soft-decision decoding;

DETAILED DESCRIPTION

Figure 1:
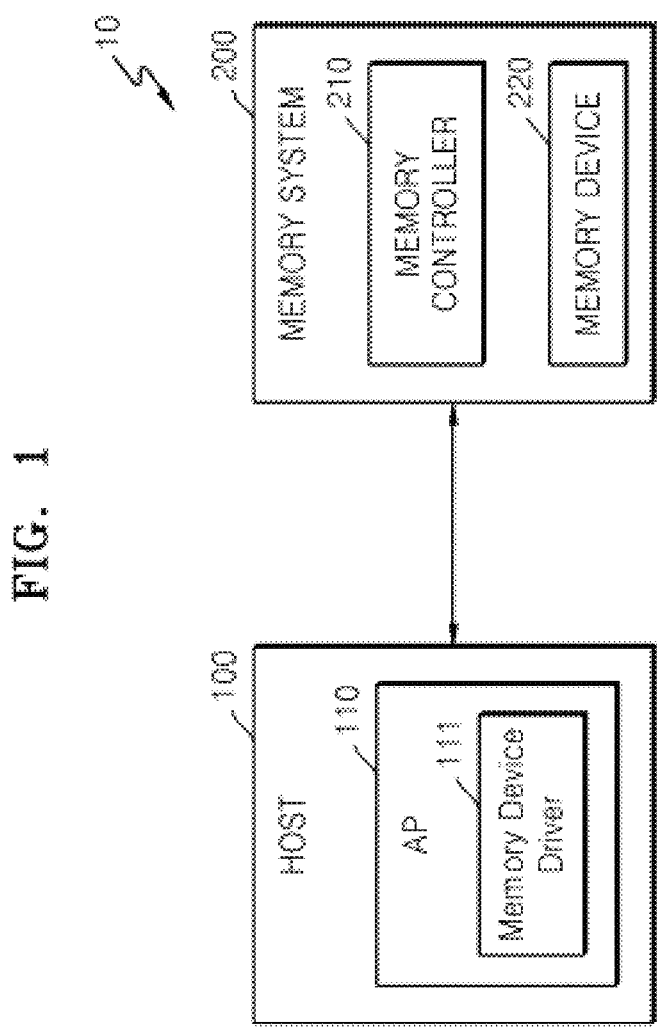
FIG. 1 is a block diagram illustrating an implementation of a data processing system including a memory system, according to an exemplary embodiment of the inventive concept.

Exemplary embodiments of the present inventive concept will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Embodiments of the inventive concept provide an efficient soft RS decoder for decoding RS codes.

RS codes are based, to a large extent, on the mathematical concepts of finite algebraic fields, linear vector spaces, dimension, affine spaces, polynomials, and linear equations.

In mathematics, a field F is a set on which addition, subtraction, multiplication, and division are defined. The elements of the field are referred to as scalars. Each field F has its own zero (e.g., $0_F$) and unit (e.g., $a+0_F=a$ and $a \cdot 1_F=a$). Examples of fields include the field of rational numbers, the field of real numbers and the field of complex numbers.

A finite field or Galois field is a field that contains a finite number of elements. The most common examples of finite fields are given by the integers mod p when p is a prime number. The order of a finite field is its number of elements, which is either a prime number or a prime power. For every prime number p and every positive integer k there are fields of size $p^k$, all of which are isomorphic (i.e., essentially the same). Finite fields are important in a number of areas of mathematics and computer science, including cryptography and coding theory.

In mathematics, physics, and engineering, a vector space (also referred to as a linear space) over a field F is a set whose elements (e.g., referred to as vectors) may be added together and multiplied by scalars from F. A linear combination of vectors $v_1, \ldots, v_n$ that belongs to a vector space V over F is defined as a linear combination, as that is a sum of these vectors where each is multiplied by a scalar $\alpha_i$ from the field F. Hence it is a vector v given by: $v=\Sigma_{1 \leq i \leq n} \alpha_i \cdot v_i$.

Vector spaces are characterized by their dimension, which specifies the number of independent directions in the space. An affine space is the set resultant by adding a fixed vector to every element in a vector space.

Polynomials over a field F, are algebraic expressions that consist of indeterminates (or variables) and coefficients. One can perform arithmetic operations such as addition, subtraction, multiplication and also positive integer exponents for polynomial expressions. An example of a polynomial of a single variable x, over the real numbers is $2 \cdot x^3+x-5$. The x occurring in a polynomial is referred to as a variable or an indeterminate. When the polynomial is considered as an expression, x is a fixed symbol which does not have any value (its value is "indeterminate"). However, when one considers the function defined by the polynomial, then x represents the argument of the function, and is therefore referred to as a "variable".

A polynomial over a field F in a single indeterminate x can always be written in the form $P(x)=\Sigma_{0 \leq i \leq n} \alpha_i \cdot x^i$ where $\alpha_i$ are elements (scalars) of the field F scalars of the field F. $\alpha_i$ are called the coefficients of the polynomial. This expression may be read as a vector (or list) of n+1 scalars. The evaluation of the polynomial P(x) in element α of the field F denoted by P(α) is defined as the scalar value resultant by replacing x with α to yield $P(\alpha)=\Sigma_{0 \leq i \leq n} \alpha_i \cdot \alpha^i$.

The degree of the polynomial P(x) is defined by the maximal index of a coefficient that is not zero. That is, the maximal i such that $\alpha_i \neq 0$. The degree of polynomial P(x) is denoted by deg(P(x)). A root of the polynomial P(x) in the field F is an element β in F such that the evaluation of polynomial P(x) in β is equal to zero. That is, it is a β in F such that: $P(\alpha)=0$.

The multiplication of the polynomial P(x) by a scalar is done multiplying each individual coefficient by that scalar. That is, for a scalar c in F we define: $c \cdot P(x) = \Sigma_{0 \leq i \leq n} c \cdot \alpha_i \cdot x^i$. The sum of two polynomials is given by adding corresponding coefficients. That is, for polynomials P(x) and Q(x) over the field F where: $P(x) = \Sigma_{0 \leq i \leq n} \alpha_i \cdot x^i$ and $Q(x) = \Sigma_{0 \leq i \leq n} b_i \cdot x^i$ and their sum is defined as: $P(x) + Q(x) = \Sigma_{0 \leq i \leq n} (\alpha_i + b_i) \cdot x^i$.

Thus, the set of polynomials over the field F constitute a vector space over F. The product of two polynomials P(x) and Q(x) is defined as the sum of the products of every pair of coefficients wherein it is attached to the added corresponding powers. The product may be defined by: $P(x) \cdot Q(x) = \Sigma_{0 \leq i,j \leq n} (\alpha_i \cdot b_j) x^{i+j} = \Sigma_{0 \leq s \leq 2n} (\Sigma_{0 \leq i,j \leq n,\ i+j=s} \alpha_i \cdot b_j) \cdot x^s$.

One polynomial g(x) divides another polynomial ƒ(x), if there exists a third polynomial h(x) whose product by the first polynomial is equal to the second polynomial.

A method of the inventive concept proposes that a first operation performed by the RS decoding system is an RS HD decoding, which includes the Berlekamp-Massey (BM) algorithm that can solve the Key equations. (✻) Throughout the BM algorithm, the method may instruct the decoder to retain in a temporary memory (e.g., a RAM) the by-products (e.g., $\sigma_i(x)$, $\omega_i(x)$) of the BM algorithm in FIG. 7. These by-products are normally not kept by RS decoders after the BM ends. In an embodiment, only if the HD fails is the SD decoder of the inventive concept then used. The first SD stage (see FIG. 8) uses the stored elements (e.g., the by-products) as building blocks for the main SD procedure. BM is described to provide the groundwork for FIG. 8. HD is mentioned here to explain the advantages offered by embodiments of the inventive concept over prior art. The key equations is a step of an RS decoding algorithm. The key equations embody a set of linear equations that encapsulate the entire network of relations between the received word and the error locations and error values.

FIG. 1 is a block diagram illustrating an implementation of a data processing system including a memory system, according to an exemplary embodiment of the inventive concept. The memory system may include the above-described RS decoder.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the non-volatile memory system 200. The host 100 may communicate with the non-volatile memory system 200 to transmit a command (e.g., a read command, a write command, an erase command, etc.) related to a memory operation and receive a confirm command in response to the transmitted command.

The non-volatile memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
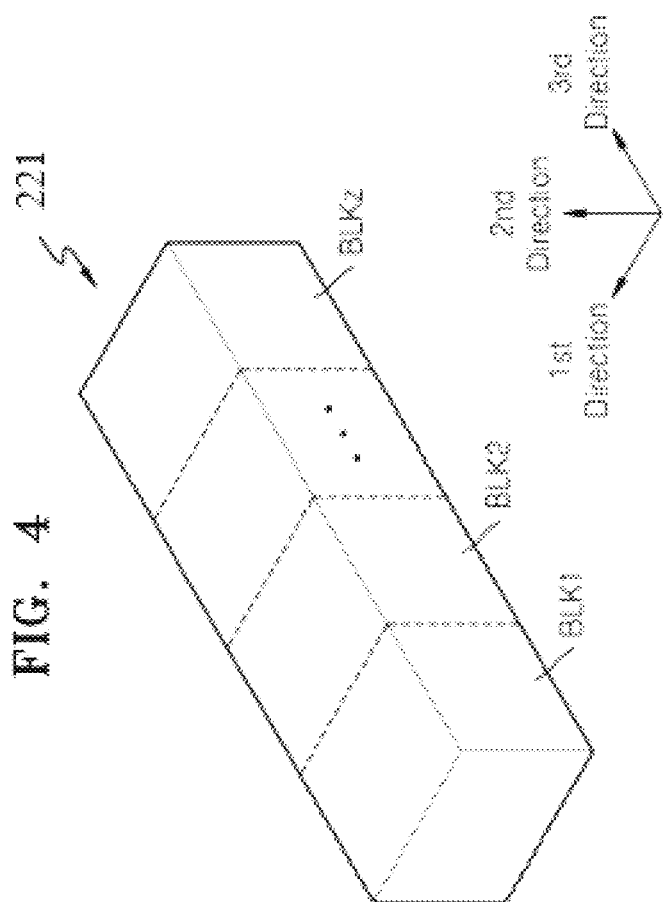
FIG. 4 is a block diagram of the memory cell array of FIG. 2, according to an exemplary embodiment of the inventive concept.

The memory device 220 may include a memory cell array that retains data stored therein, even when the memory device 220 is not powered on. The memory cell array may include as memory cells, for example, a NAND or NOR flash memory, a magnetoresistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
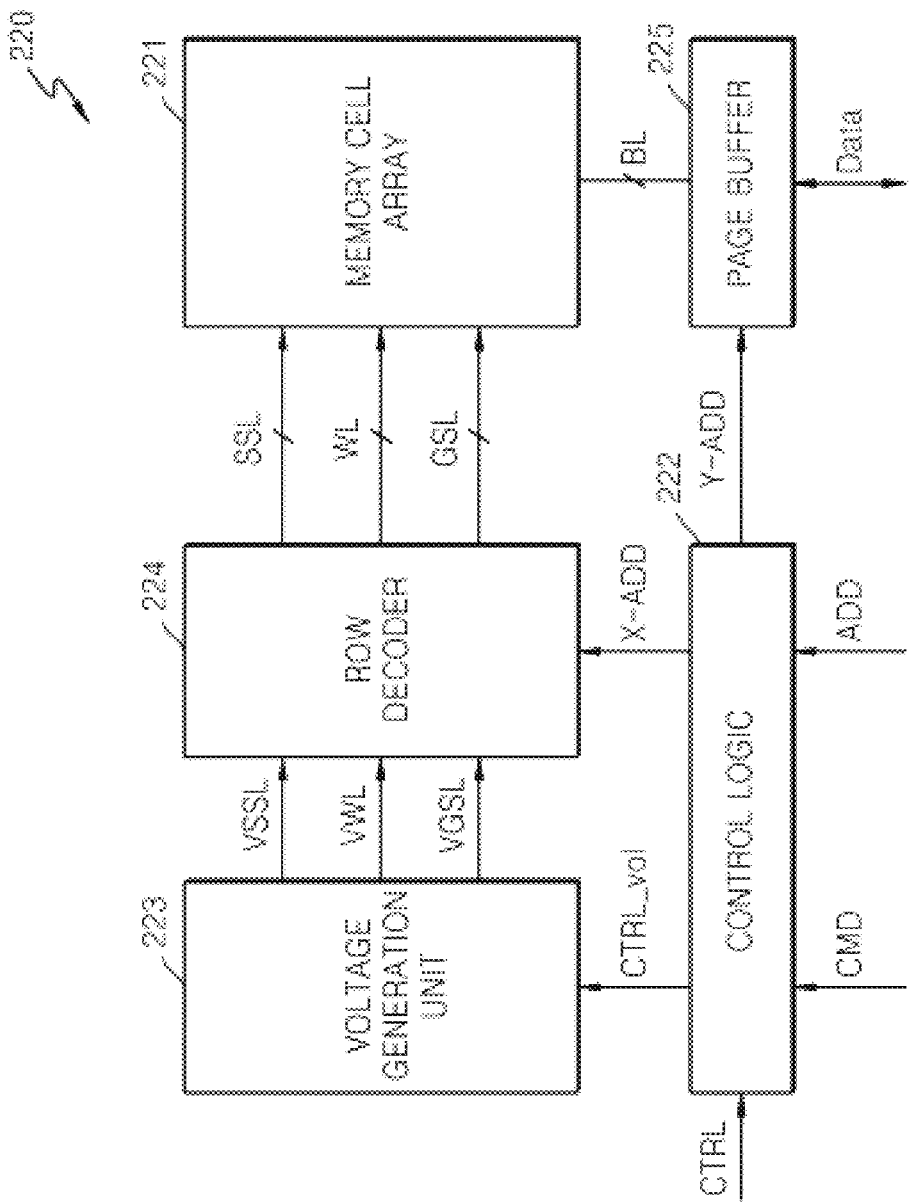
FIG. 2 is a detailed block diagram of a non-volatile memory device of FIG. 1, according to an exemplary embodiment of the inventive concept.

FIG. 2 is a detailed block diagram of the non-volatile memory device 220 of FIG. 1, according to an exemplary embodiment of the inventive concept.

Referring to FIG. 2, the non-volatile memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the non-volatile memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 3:
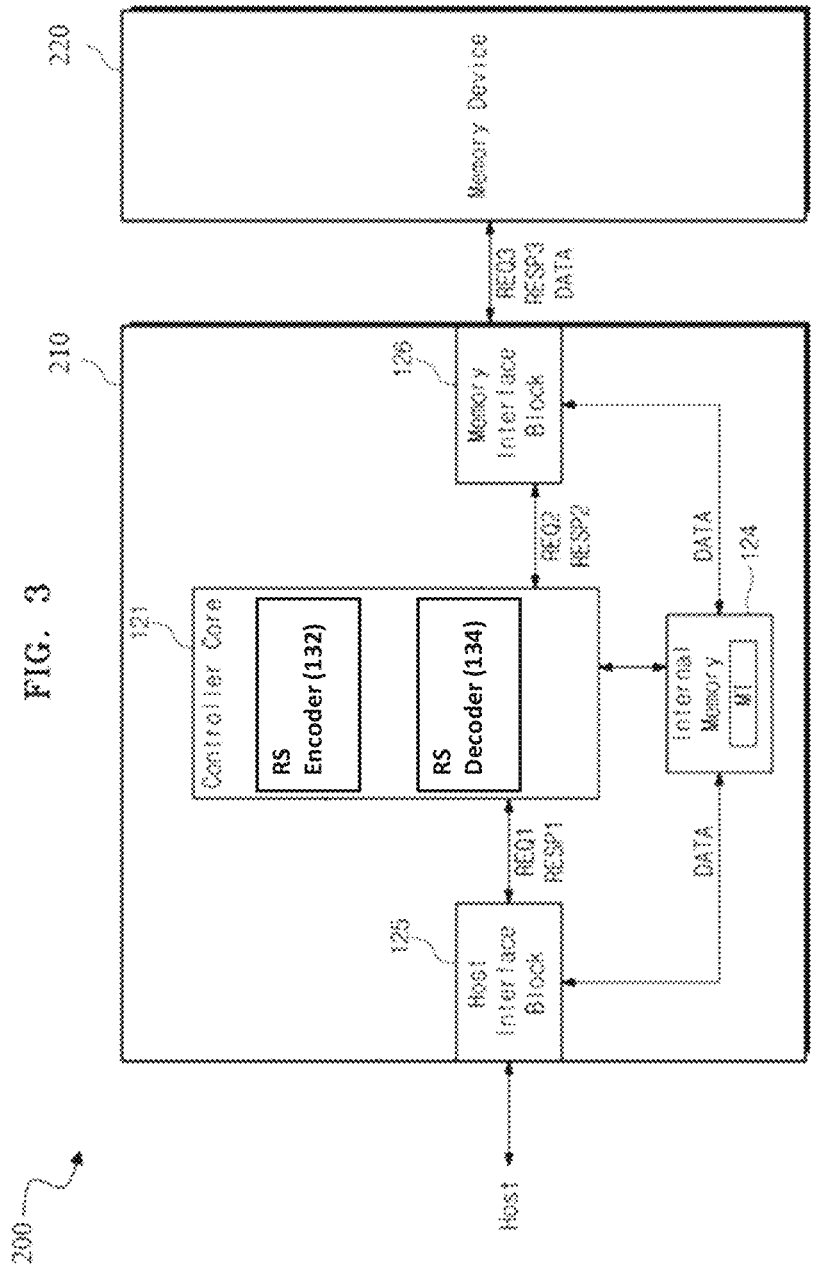
FIG. 3 is a block diagram illustrating the memory system of FIG. 1, according to an exemplary embodiment of the inventive concept.

FIG. 3 is a block diagram illustrating the memory system 200 of FIG. 1, according to an exemplary embodiment of the inventive concept.

Referring to FIG. 3, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 121, an internal memory 124, a host interface block 125, and a memory interface block 126.

The controller core 121 may include an RS encoder 132 and an RS decoder 134. The controller core 121 may control and access the memory device 220 depending on a request received from the host 100 or an internally designated schedule. The controller core 121 may manage and execute various metadata and codes used to manage or operate the memory system 200. The controller core 121 may perform error detection and correction on data read from memory cells of the memory device 220 using the RS decoder 134.

The internal memory 124 may be used, for example, as a system memory which is used by the controller core 121, a cache memory which stores data of the memory device 220, or a buffer memory which temporarily stores data between the host 100 and the memory device 220. The internal memory 124 may additionally store a mapping table MT that indicates a relationship between logical addresses from the Host Device 100 assigned to the memory system 200 and physical addresses of the memory device 220. The internal memory 124 may include, for example, a dynamic random access memory (DRAM) or a static random access memory (SRAM). The internal memory 124 may be a buffer.

The host interface block 125 may include a component for communicating with the host 100 such as, for example, a physical block. The memory interface block 126 may include a component for communicating with the memory device 220 such as, for example, a physical block.

The host interface block 125 may provide the memory control core 122 with a first request REQ1 received from the host 100. The first request REQ1 may include a command (e.g., a read command or a write command) and a logical address. The memory control core 122 may translate the first request REQ1 to a second request REQ2 suitable for the memory device 220.

For example, the controller core 121 may translate a format of the command. The controller core 121 may obtain address information AI with reference to the mapping table MT stored in the internal memory 124. The controller core 121 may translate a logical address to a physical address of the memory device 220 by using the address information AI. The controller core 121 may provide the second request REQ2 suitable for the memory device 220 to the memory interface block 126.

The memory interface block 126 may register the second request REQ2 from the controller core 121 at a queue. The memory interface block 126 may transmit a request that is first registered at the queue to the memory device 220 as a third request REQ3.

When the first request REQ1 is a write request, the host interface block 125 may write data received from the host 100 to the internal memory 124. When the third request REQ3 is a write request, the memory interface block 126 may transmit data stored in the internal memory 124 to the memory device 220.

When data is completely written, the memory device 220 may transmit a third response RESP3 to the memory interface block 126. In response to the third response RESP3, the memory interface block 126 may provide the controller core 121 with a second response RESP2 indicating that the data is completely written.

After the data is stored in the internal memory 124 or after the second response RESP2 is received, the controller core 121 may transmit a first response RESP1 indicating that the request is completed to the host 100 through the host interface block 125.

When the first request REQ1 is a read request, the read request may be transmitted to the memory device 220 through the second request REQ2 and the third request REQ3. The memory interface block 126 may store data received from the memory device 220 in the internal memory 124. When data is completely transmitted, the memory device 220 may transmit the third response RESP3 to the memory interface block 126.

As the third response RESP3 is received, the memory interface block 126 may provide the controller core 121 with the second response RESP2 indicating that the data is completely stored. As the second response RESP2 is received, the controller core 121 may transmit the first response RESP1 to the host 100 through the host interface block 125.

The host interface block 125 may transmit data stored in the internal memory 124 to the host 100. In an exemplary embodiment, in the case in which data corresponding to the first request REQ1 is stored in the internal memory 124, the transmission of the second request REQ2 and the third request REQ3 may be omitted.

Figure 5:
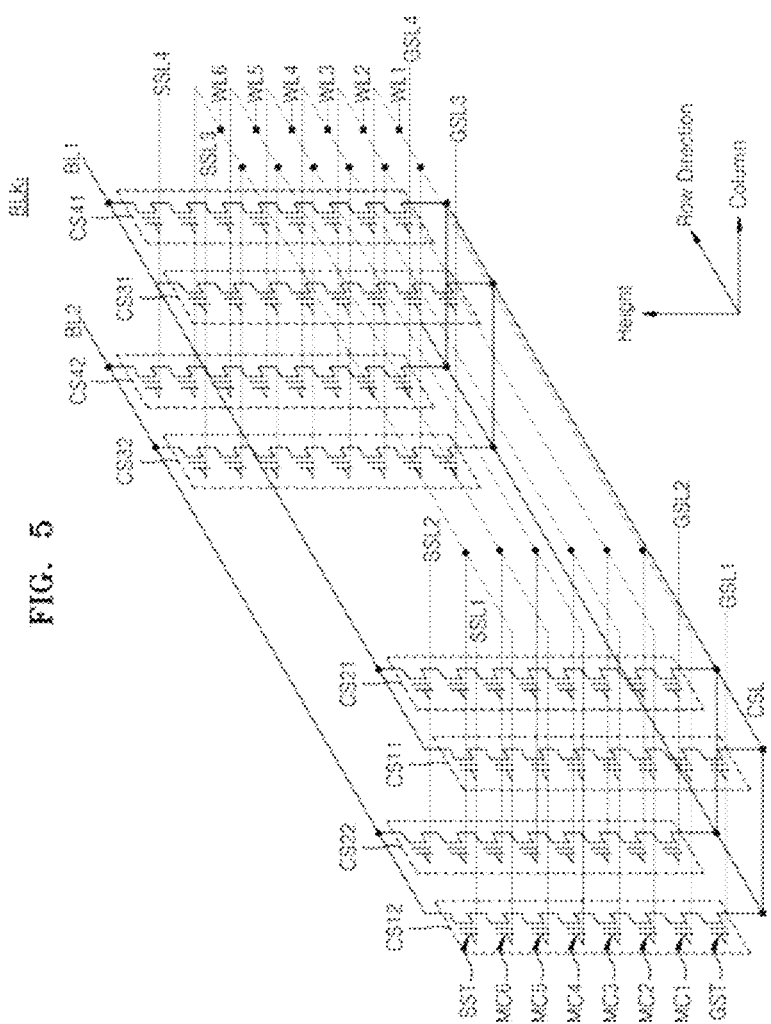
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Figure 6:
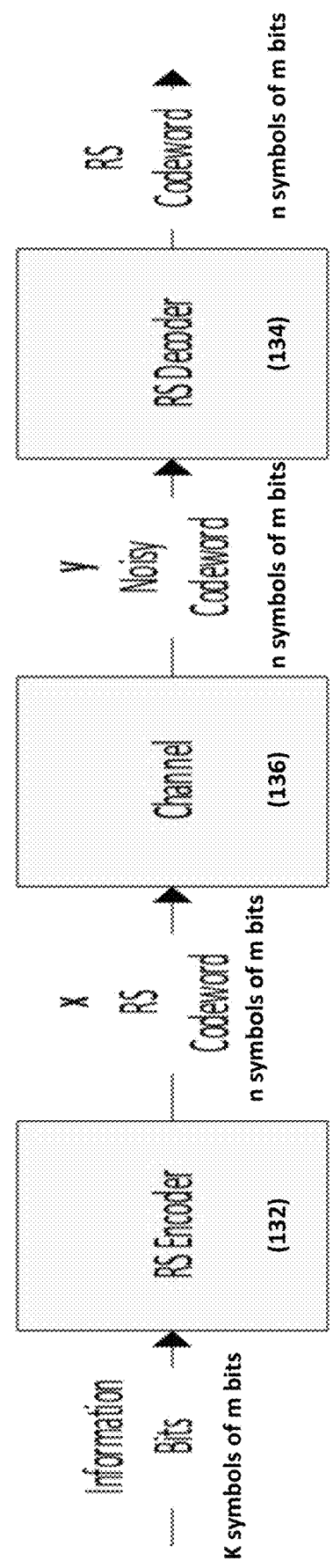
FIG. 6 illustrates a flow a data to an encoder of a system according to an embodiment of the inventive concept.

FIG. 6 illustrates a flow of encoded data to the system. The memory controller 210 may receive DATA (e.g., Information Bits including K symbols of m bits) from the Host and output the DATA to the RS encoder 132. The DATA may be received along with a write request and write address. The RS encoder 132 operates on the Information Bits to generate an RS codeword x (e.g., including n symbols of m bits). Here K, m, and n are positive integers greater than 0. The memory controller 220 may store the RS codeword x in the memory device 220 a location based on the write address. At a later time, the Host may send a read request along with a read address for reading back the RS codeword x. The RS codeword x may be read through a Channel 136 such as the Memory Interface block 126 to the memory controller 210. However, due to noise, the RS codeword may become converted into a Noisy codeword y (e.g., including n symbols of m bits) that has one or more errors. The RS decoder 134 of the memory controller 210 decodes the codeword y back to the original RS codeword x for output to the Host, assuming it is able to correct all the errors. If the RS decoder 134 is unable to correct the errors, the memory controller 210 may output an error message to the Host.

The RS decoder 134 performs an efficient soft decoding of an RS code. An (n, k, d) RS code is defined over a Galois field with symbols of m bits. The Galois field may be denoted as F, where $|F|=2^m$. Here n is the code length (number of symbols), wherein $n<2^m$, k is the number of information symbols, and d is the RS code minimal distance.

A RS code is a Minimum Distance Separable (MDS) that achieves the Singleton bound (d≤n−k+1).

It is assumed that the channel 136 is an independent identical distributed channel, where each symbol $x_i$ of the codeword x passes through the channel independently, that is $(y|x)=\Pi_{i=1}^{n}P(y_i|x_i)$. The output symbol may be an erasure (e) with probability $P_e$, the correct transmitted symbol q with probability $P_c$, or a different symbol (an error) p according to Equation A below.

$$P(y|x=q) = \begin{cases} e & w \cdot pP_e \\ q & w \cdot pP_c \\ p & p \in F, p \neq q \end{cases}$$ [Equation A]

In Equation A, p≠q, where p∈ F and is typically uniformly distributed among the field symbols. Each symbol has probability $$P_s = \frac{1 - P_e - P_c}{2^m - 1}$$

or with some other distribution.

The RS decoder 134 receives an output codeword y of the channel 136 and estimates the originally transmitted codeword x. The RS decoder 134 is a soft decision (SD) decoder.

An RS Hard Decision (HD) decoder uses the Berlekamp-Massey (BM) algorithm and the Forney algorithm, where the decoder's aim is to find a code-word (CW) with the minimal Hamming distance from the received code word according to Equation B.

$$\hat{x} = \arg\min_{c \in RS(n,k,d)} d_H(y, c)$$ [Equation B]

The Hamming distance $d_H(y, c)$ is defined according to Equation C.

$$d_H(y, c) = \sum_{i=1}^{n} \delta(y_i \neq c_i \text{ and } y_i \neq e)$$ [Equation C]

where $\delta(A) = \begin{cases} 1 & A \text{ is TRUE} \\ 0 & o.w. \end{cases}$

The set of indexes of the symbols $y_i$ with erasures is denoted by Equation D. An erasure is a symbol in the original transmitted codeword x that is missing from the received codeword y.

$$E = \{i | y_i = e, i \in [n]\}$$ [Equation D]

The set of indexes of the symbols $y_i$ with errors is denoted by Equation E. A symbol with an error means that the symbol in the original transmitted codeword x has a different value from the corresponding symbol in the received codeword y.

$$T = \{i | y_i \neq x_i, y_i \neq e, i \in [n]\}$$ [Equation E]

A correct solution is guaranteed if the following Equation 1 is satisfied.

$$|E| + 2 \cdot |T| \leq d - 1$$ [Equation 1]

From Equation 1, it follows that the code error correction capability is $$t = \left\lfloor \frac{d-1}{2} \right\rfloor$$

and the correct solution is guaranteed if $|T| \leq t$.

At least one embodiment of the inventive concept enables a lossless elimination of the erasures and passage to setting with only errors. Thus, it is assumed that there are only errors henceforth.

The evaluation set Q of an RS code includes $\alpha_j$ distinct elements of F and is defined as $Q = \{\alpha_1, \alpha_2, \ldots \alpha_n\}$.

An error Locator Polynomial (ELP) is defined by the following Equation a1. The ELP may be used to determine the locations of symbols that have errors.

$$\Lambda(x) = \Pi_{j \in T}(1 - \alpha_j \cdot x)$$ [Equation a1]

The ELP has degree $|T|$, is separable and its roots are $\alpha_j^{-1}$ for j∈ T. Here, $\Lambda(0)=1$. If the roots of the ELP are known, the error locations are known.

An Error Evaluator Polynomial (EEP) is defined by following Equation a2. While the ELP indicates the error locations, the EEP may be used to recover the error values via a Forney algorithm.

$$\Gamma(x) = \Sigma_{j \in T} \Pi_{i \in \backslash \{j\}}(1 - \alpha_i \cdot x)$$ [Equation a2]

Thus, knowledge of the ELP and EEP enables the RS decoder 134 to detect and correct errors. At least one embodiment of the inventive concept provides an algorithm for determining the EEP assuming the ELP is given, known, or determinable.

The RS decoder 134 may generate a Syndrome Polynomial S(x) during its decoding. The Syndrome Polynomial S(x) is denoted by the following Equation b1.

$$S(x) = \sum_{i=0}^{2t-1} S_i \cdot x^i$$ [Equation b1]

In Equation b1, $S_i$ are the coefficients of the Syndrome Polynomial S(x) and $x^i$ are the terms of the Syndrome Polynomial S(x) (e.g., $x^3$, $x^2$, etc.). The coefficients $S_i$ are calculated from the received codeword using the following Equation b2.

$$S_i = \Sigma_{1 \leq j \leq n} y_j \alpha_j^i, 0 \leq i \leq 2t-1$$ [Equation b2]

If the number of errors does not exceed 2t, the ELP and the EEP satisfy Equation b3 and also b4, b5, b6.

$\Lambda(x) \cdot S(x) = \Gamma(x) \bmod(x^{2t})$—key equations [Equation b3]

The key equations satisfy properties of Equations b4-b6.

$\deg(\Gamma(x)) < \deg(\Lambda(x))$ [Equation b4]

$\Lambda(0) = 1$ [Equation b5]

$\gcd(\Lambda(x), \Gamma(x)) = 1$ [Equation b6]

The Equation b3 means that every coefficient of the polynomial $P(x) = \Lambda(x) \cdot S(x)$ whose index is between zero and 2t−1 is equal to the corresponding coefficient in $\Gamma(x)$.

The equation b5 means that the first coefficient of $\Lambda(x)$ (i.e., the coefficient whose index is zero) is equal to one.

The equation b6 means that there is no polynomial with positive degree that divides both $\Lambda(x)$ (e.g., the ELP) and $\Gamma(x)$ (e.g., the EEP).

The RS HD decoding algorithm is a process that tries to find the ELP and EEP. When it succeeds it recovers the transmitted codeword.

When $|T|\le t$, it is guaranteed that there exists a unique pair of polynomials in F[x]: ($\lambda(x)$, $\gamma(x)$), which satisfies the following four conditions, and it is also guaranteed that $\Lambda(x)$ is equal to the ELP and $\gamma(x)$ is equal to the EEP. The four conditions are as follows: I) $\lambda(x) \cdot S(x) = \gamma(x) \mod(x^{2r})$, II) $\lambda(0)=1$, III) $\deg(\gamma(x)) < \deg(\lambda(x)) \le t$, and IV) $\gcd(\lambda(x), \gamma(x))=1$. Note that by (II), the free coefficient of $\lambda(x)$ is equal to 1. The Berlekamp-Massey (BM) algorithm finds the unique ($\lambda(x)$, $\gamma(x)$), that satisfies (I)-(IV) when $|T|\le t$. The BM algorithm uses an iterative process assisted by an auxiliary polynomial $\omega(x)$ to find the ELP, which is illustrated in FIG. 7. In this algorithm, μ is the last index for which the "If" condition holds. The term $\sigma_i(x)$ corresponds to an "evolving ELP" at a given stage in the iterative process that seeks the ELP. The term $\omega_i(x)$ corresponds to an "evolving EEP".

(※) Once the ELP candidate (e.g., $\Lambda(x)$) is determined, a Chien Search may be performed to find the error locations of the symbols within the received codeword y that have errors. One method for finding the error locations, evaluates $\Lambda(x)$ on all the inverses of elements in Q by computing $\Lambda(\beta^{-1}) \forall \beta \in Q$. When $\Lambda(\alpha_i^{-1})=0$, then i is one of the error indices. In HD, when a polynomial $\lambda(x)$ is an ELP candidate then it becomes a final candidate after the procedure illustrated in FIG. 8 is performed. If $|T|\le t$, the number of distinct roots that $\lambda(x)$ has (※) is equal to $\deg(\Lambda(x))$.

In many practical situations, the channel 136 includes additional information on the channel symbols. For each symbol $x_i$, information may be present as follows:

$$x_i = \begin{cases} y_i & w.p. & P_i \\ o.w. & w.p. & 1-P_i \end{cases}$$

When $P_i=1$, there is a complete confidence that $y_i$ is the correct value. The set of weak indices $W=\{i|P_i \le P_{th}, i \in [n]\}$, is defined as the set of indices with confidence probability below some threshold $P_{th}$. A naive soft decision algorithm will puncture every subset of 2r+1 coordinate of the set W and apply the above-mentioned HD decoding algorithm. Puncturing the index i means replacing the channel value with an erasure $y_i=e$. The confidence probability may be determined from channel soft information of the channels used to transmit the symbols of a codeword. For example, the channel soft information may include a probability for each symbol that indicates how likely the symbol is to be correct.

In an embodiment, the RS decoder 134 performs a soft decision decoding algorithm with the ability to correct t+r errors for $1 \le r < t$. The soft decision decoding algorithm receives an additional input of the set W of indexes of weak symbols of the size |W|. The solution of the soft decision decoding algorithm is based on two observations I) if the number of errors |T|=t+r, then the ELP is included in an affine space of polynomials of dimension 2r, whose basis is accessible to the decoder (e.g., this affine space is the set of solutions to a suitable key equation), and II) if the set W includes at least 2r+1 errors, then it is guaranteed that the ELP is included in a small list of polynomials that the decoder 134 finds when r and |W| are not too large.

The proposed SD-RS decoder finds a short list of pairs of polynomials. When the overall number of errors is t+r and W includes at least 2r+1 errors, then the pair (ELP, EEP) is guaranteed to be in this list. The list includes all the pairs of polynomials in F[x], ($\lambda(x)$, $\gamma(x)$), which satisfies the 6 conditions illustrated in FIG. 9.

When conditions 1-3 of FIG. 9 holds, the key equations are equivalent to the set of (2t)×(t+r+1) linear equations which are illustrated in FIG. 10. With the equation $\lambda_0 \equiv 1$, the ELP can be written by Equation 2 and the EEP can be written by Equation 3.

$$\lambda(x) = \sum_{i=0}^{t+r} \lambda_i \cdot x^i \qquad \text{[Equation 2]}$$

$$\gamma(x) = \sum_{i=0}^{t+r-1} \gamma_i \cdot x^i \qquad \text{[Equation 3]}$$

The set of linear equations is also written by Equation 4 as follows:

$$\underline{V} \cdot \lambda = \begin{bmatrix} \gamma \\ 0 \end{bmatrix} \qquad \text{[Equation 4]}$$

Since $\gamma(x)$ is chosen freely in this set of linear equations, the set of first t+r equations is redundant and FIG. 10 is equivalent to the set of the t−r linear [nonhomogeneous] equations on t+r unknown over F, comprising the last t−r rows. In this set, the unknown are the coefficients of $\lambda(x)$.

The effectiveness of the algorithm is connected to the fact that the conditions of FIG. 10 hold the dimension of the affine space of solutions to FIG. 10 is 2·r. The ELP is in the affine space of solutions to FIG. 10. Therefore, the ELP can be represented by the following Equation 5:

$$\lambda(x) = \sum_{i=1}^{2r+1} g_i \cdot \lambda_i(x) \qquad \text{[Equation 5]}$$

where $\{\lambda_i(x)\}_{i=1}^{2r}$ is a basis to the space of solutions of the homogenous linear equations in LE, $\lambda_{2r+1}(x)$ is one solution to the nonhomogeneous equations in LE, and $\{g_i\}$ are scalars in the field F and $g_{2r+1}=1$. If only 2r errors were required in the set of weak locations, while a ELP would have been found that meets the requirements of FIG. 9, it would have resulted in a very large number of other polynomials (*) that meet these requirements. By requiring 2·r+1 errors in the weak set W, the list of polynomials that meet the requirements of FIG. 9 is typically very short, and the ELP is always one of them, because it allows for one extra equation to screen false candidates. In practice, in vast majority of the cases, the ELP is the only polynomial in the list.

Figure 11:
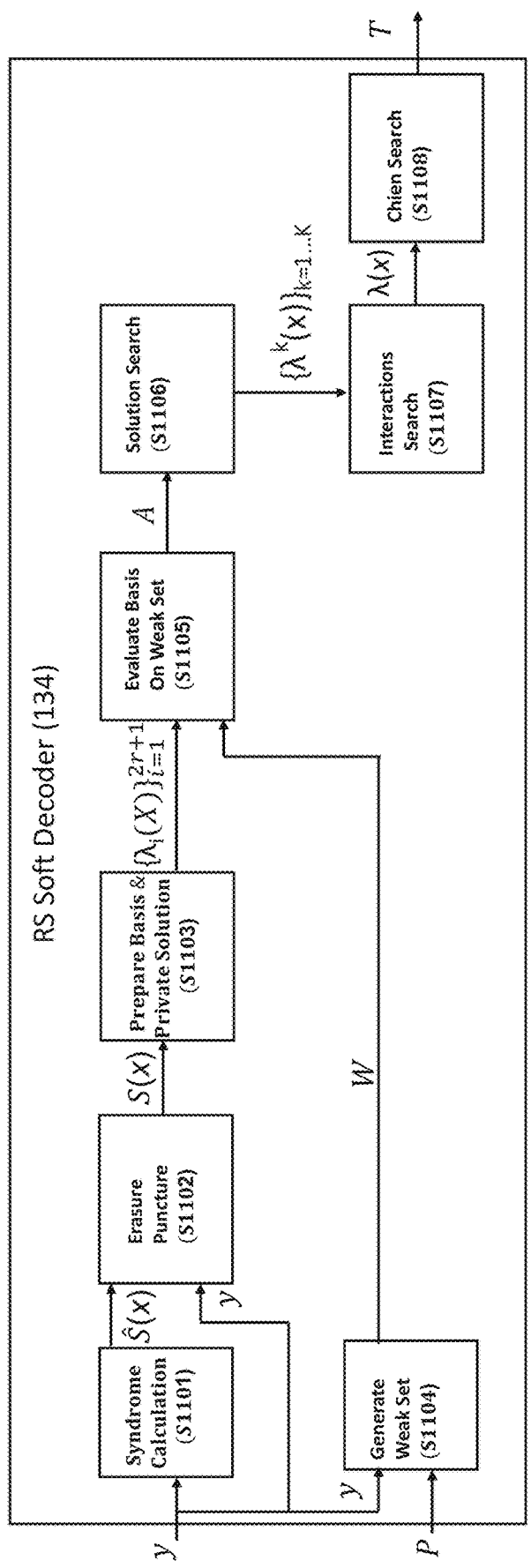
FIG. 11 illustrates operations that may be performed by the encoder according to an exemplary embodiment of the inventive concept.

FIG. 11 illustrate operations performed by the RS decoder 134 based on an input codeword y and input channel probabilities P to determine error locations (e.g., T) of symbols in the codeword y according to an exemplary embodiment of the inventive concept. The codeword y can be corrected using the determined error locations to estimate the originally transmitted codeword x.

The RS decoder 134 first performs a syndrome calculation on the input code-word y to generate a syndrome polynomial Ŝ (S1101). The code-word y includes n symbols $y_1$-$y_n$. The following Equation 6 is used to calculate the syndrome polynomial Ŝ.

$$\hat{S}(x) = \sum_{i=0}^{2t-1} \hat{S}_i \cdot x^i \qquad \text{[Equation 6]}$$

In equation 6, t is the code error correction capability where $t = \lfloor (d-1)/2 \rfloor$, $x^i$ are terms of the syndrome polynomial Ŝ, and $\hat{S}_i$ are syndrome coefficients of the syndrome polynomial $\hat{S}$. The parameter d is the (❋) minimal hamming distance of the code. The Hamming distance d is determined from the set E of the symbols with erasures and the set T of the symbols with errors according to above Equation 1, where a correct solution is guaranteed if $|T|\leq t$.

The syndrome coefficients $\hat{S}_i$ are calculating using the following Equation 7.

$$\hat{S}_i = \Sigma_{1 \leq j \leq n} y_j \cdot \alpha_j^i \, 0 \leq i \leq 2t-1 \quad \text{[Equation 7]}$$

In Equation 7, $y_j$ are the symbols of the input codeword y and (❋) $\alpha_j$ are the RS code locators, which are elements of the Galois Field F.

The RS decoder 134 next performs a puncture calculation on the syndrome polynomial $\hat{S}$ to generate a new syndrome polynomial S(x) (step S1102). The new syndrome polynomial S(x) does not consider the erasures located within the input codeword y. An erasure means that a symbol of the originally transmitted codeword x was lost.

The puncture calculation includes calculation of an Erasure Location Polynomial (Erasure LP) $\lambda_E(x)$ that represents the locations of the erasures within the input codeword y and a post-Erasure syndrome $\tilde{S}(x)$. The Erasure LP $\lambda_E(x)$ is calculated using the following Equation 8, the post-Erasure syndrome $\tilde{S}(x)$ is calculated using the following Equation 9, and the New syndrome S(x) is calculated using Equation 10 where $S_j = \tilde{S}_{j|E|}$ for $j \in \{0, 1, \ldots, d-|E|-2\}$ and d may be referred to as d–|E| for simplicity as if there were no erasures in the channel 136.

$$\lambda_E(x) = \prod_{j \in E}(1 - x \cdot \alpha_j) \quad \text{[Equation 8]}$$

$$\tilde{S}(x) = \lambda_E(x) \cdot \hat{S}(x) \bmod(x^{d-1}) \equiv \sum_{j=0}^{d-2} \tilde{S}_j \cdot x^j \quad \text{[Equation 9]}$$

$$S(x) \equiv \sum_{j=0}^{d-2-|E|} S_j \cdot x^j \quad \text{[Equation 10]}$$

Next, the RS decoder 134 prepares a basis $\{\lambda_i(x)\}_{i=1}^{2r}$ to the space of solutions of the set of homogeneous linear equations of FIG. 10 based on the new syndrome polynomial S(x) and generates a private solution $\lambda_{2r+1}(x)$ to the non homogeneous equations of FIG. 10. The said basis and said private solution may be found by performing a Gaussian elimination.

Figure 12:
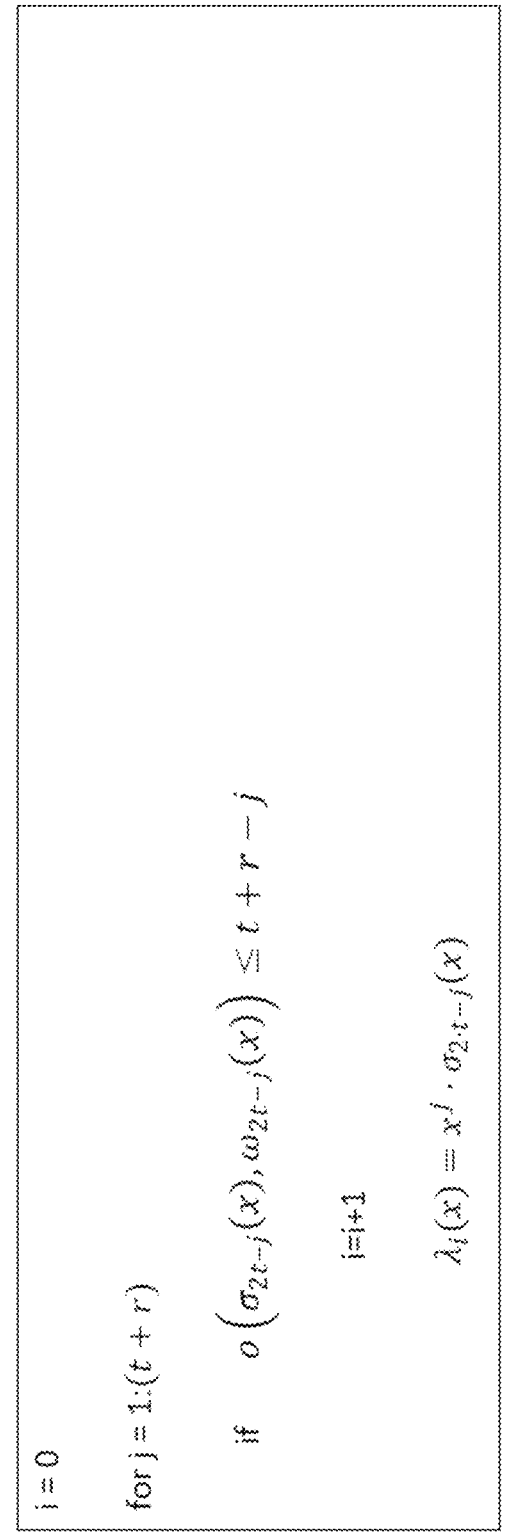
FIG. 12 illustrates an algorithm for determining an affine space usable by the encoder to correct a codeword.

In a preferred embodiment, the basis $\{\lambda_i(x)\}_{i=1}^{2r}$ may be generated with far less complexity using the intermediate outputs a $\sigma_i(x)$ of a Berlekamp-Massey (BM) algorithm as shown in FIG. 7. FIG. 12 which demonstrates an algorithm for determining the said basis using the by-products ($\sigma_i(x)$, $\omega_i(x)$) (e.g., by-products) of the BM algorithm. These byproducts of the BM algorithm are used as inputs to the algorithm of FIG. 12 to generate the basis $\{\lambda_i(x)\}_{i=1}^{2\cdot r}$ as its output. A private solution to the linear equations of FIG. 10 is the BM algorithm output: $\lambda_{2 \cdot r+1}(x) = \sigma_{2r}(x)$.

Next, the RS decoder 134 determines a weak set W from the input code-word y (step S1104), which includes the indices of symbols of the input code word y with confidence (e.g., a confidence probability) below some threshold $P_{th}$. Step 1104 may be performed before or after any of steps S1101-S1103.

Next, the RS decoder 134 computes a matrix A from $\{\lambda_i(x)\}_{i=1}^{2r+1}$ and the weak set W(S1105). The computation of the matrix A may be referred to as evaluating the basis on the weak set. The set of indices with higher error probability is denoted as W={$i_1, i_2, \ldots i_{|W|}$}. Each polynomial of the affine space is given according to Equation 11.

$$\lambda(x) = \sum_{j=1}^{2 \cdot r} g_j \cdot \lambda_j(x) + \lambda_{2r+1}(x) \quad \text{[Equation 11]}$$

For a polynomial to be the ELP, the requirement of $\lambda(\alpha_{i_j}^{-1}) = 0 \; j \in J$ needs to be satisfied wherein $J \subseteq [|W|]$ is a subset of size 2r+1. To verify this requirement, the RS decoder 134 computes the matrix shown in part (a) of FIG. 13 where $\lambda_j(\alpha_{i_k}^{-1})$ is the evaluation of the polynomial $\lambda_j(x)$ at value $\alpha_{i_k}^{-1}$, which corresponds to a point in the weak set.

Next, 2r+1 elements can be found in the weak set, represented by mutually different $p_i \in [|W|]$ (with $i \in [2 \cdot r+1]$) such that the requirement is met as shown in part (b) of FIG. 13. In a straightforward approach, it means choosing all the combinations of $2 \cdot r+1$ rows from W (i.e., $$\binom{w}{2 \cdot r + 1}$$

combinations) and solving $(2 \cdot r+1) \times (2 \cdot r)$ linear equations for each combination.

Next, the RS decoder 134 performs a solution search on the matrix A to determine candidates for the ELP (step S1106). The solution search may include solving the following Equation 12 where $A_k$ is a subset of the matrix A, of size $2r \times (2r+1)$, where $2 \cdot r$ rows have been selected from A.

$$A_k \cdot g = 0, k = 1, 2, \ldots, K = \binom{|W|}{2 \cdot r} \quad \text{[Equation 12]}$$

There are $$\binom{|W|}{2 \cdot r}$$

such selections, and $$k = 1, 2, \ldots K = \binom{|W|}{2 \cdot r}$$

are the indices of the different selections. For each k, there is a solution $g^k = [g_1^k, g_2^k, \ldots g_{2r+1}^k]$ of coefficients which is a valid solution of the ELP $\lambda^k(x)$ according to the following Equation 13.

$$\lambda^k(x) = \sum_{i=1}^{2r+1} g_i^k \cdot \lambda_i(x) \quad \text{[Equation 13]}$$

The above linear equations can be solved by performing a Gaussian Elimination (GE) process and sharing intermediate calculations to find efficiently different candidates of rows selection, based on a structure with lexicographic order.

There are three types of GE operations that may performed on a matrix whose entries are in an algebraic field. Type 1 is adding a product of one row to another, type 2 is a product of one row by a scaler different than zero, and type 3 is interchanging two rows.

A matrix is in Reduced Row Echelon (RRE) form if it satisfies conditions: (1) all rows consisting of only zeroes are at the bottom, (2) the leading coefficient of a nonzero row is always strictly to the right of the leading coefficient of the row above it, (3) the leading entry in each nonzero row is a 1 (called a leading 1), and (4) each column containing a leading 1 has zeros in all its other entries.

Lexicographical order (also known as dictionary order) is a generalization of the alphabetical order of the dictionaries to sequences of ordered symbols.

The following algorithm according to an embodiment of the inventive concept is an iterative process in which each iteration starts with a submatrix of A that was transformed to RRE form in previous iterations. The present iteration adds to it a new row from A. It then uses a procedure illustrated in FIGS. 14A and 14B to turn the extended matrix to RRE form. The order of the sub matrices in the algorithm is similar to a depth first tree, but there are subtle differences that significantly reduce the complexity. The algorithm uses very little memory.

Each iteration starts with a submatrix B, of A in RRE form. This submatrix comprises the rows $1 \leq i_1 < i_2 < \ldots i_s \leq w$ of A. During this iteration the running memory contains [a compressed version of] the RRE forms of each sub-matrix of B, called here B(u), with $1 \leq u < s$, wherein B(u) is the matrix comprising of the rows $1 \leq i_1 < i_2 < \ldots < i_u \leq w$ of A.

The algorithm can by be viewed as a tree, wherein at the leaves of this tree there is an Mx(M+1) matrix B (over F) with the property that its first M columns are linearly independent. Such a matrix may be referred to as Strongly Full Ranked (SFR). For such a matrix B, there is a unique vector $x=[x_1, \ldots, x_M, 1]^T$ with entries in F such that $B \cdot x=0$. x is referred to as the annihilator of B, and x is an (M+1)-length column vector with entries in F whose bottom entry is 1. In an embodiment of the algorithm, M=2r.

It is assumed that a subset $U \subseteq [w]$ is written as an increasing sequence: $U=\{1 \leq u_1 < u_2 < \ldots < u_s \leq w\}$. $A_U$ is submatrix of A whose first row is the $u_1$ row of A and its second row is the $u_2$ row of A, etc. The algorithm process every $A_U$ when U belongs to the following set: $\Omega=\{U \subseteq [w]: 1 \leq |U| \leq 2r-1, w-(2r-|U|+1) \geq \max(U)\} \cup \{U \subseteq [w]: |U|=2r, |U \cap \{w-1,w\}| \leq 1\}$. It turns $A_U$ into RRE form written by $B_U$.

The unit matrix of size n is the n×n square matrix with ones on the main diagonal and zeros elsewhere. An example of a 3×3 unit matrix $$A \text{ is} = \begin{bmatrix} 1 & 0 & 0 \\ 0 & 1 & 0 \\ 0 & 0 & 1 \end{bmatrix}.$$

The major intermediate goal of this algorithm is to process and assess every matrix $A_U$ where U is in $\Omega$ and $|U|=2r$. Notice that this $A_U$ is a sub matrix of A comprising 2r rows of A. If $A_U$ is not SFR, then the processing of $A_U$ is halted. Otherwise $A_U$ is SFR and therefore also $B_U$ is SFR. In such an event, the first 2r columns of $B_U$ form a 2r×2r unit matrix and the annihilator $x_U$ of $B_U$ is the last column of $B_U$ with a 1 added at the end. Thus, $x_U$ is a (2r+1) column vector with entries in F whose bottom entry is 1. The decoder 134 stores $x_U$ or a signature of $x_U$ in a low cost manner (e.g. by storing the first symbol). The parameter U can be written according to the Equation 14 and the decoder has a fast and low cost mechanism to find out if there exists $U' \in \Omega$ according to the Equation 15

$$U=\{1 \leq u_1 < u_2 < \ldots < u_{2r-1} < u_{2r} \leq w\}. \quad \text{[Equation 14]}$$

$$U'=\{1 \leq u_1 < u_2 < \ldots u_{2r-1} < u'_{2r} \leq w\} \quad \text{[Equation 15]}$$

for which: $u'_{2r} < u_{2r}$ and $x_U = x_{U'}$. Such an event may be referred to as a collision event. These are rare events and one (or more) of these events leads to finding the ELP when $|T|=t+r$ and $|T \cap W| \geq 2r+1$.

Looking back at the sets U and U' one sees that they differ in only the last element. When $U^* = U \cup U'$ is defined, then $U^*$ is of size 2r+1 and $U^*=\{1 \leq u_1 < u_2 < \ldots < u_{2r-1} < u'_{2r} < u'_{2r} \leq w\}$. Thus, it holds for $x = x_U = x_{U'}$ that: $A_{U^*} \cdot x = 0$. Further, for $x=[x_1, \ldots, x_{2r}, 1]^T$, it holds that the polynomial of Equation 16 is an ELP candidate.

$$\lambda(x) = \sum_{j=1}^{2r} x_j \cdot \lambda_j(x) + \lambda_{2r+1}(x) \quad \text{[Equation 16]}$$

Next, the RS decoder 134 checks if $\lambda(x)$ satisfies the conditions in FIG. 9. If the answer is yes, then $\lambda(x)$ is a full ELP candidate.

The following lexicographic order defines the search that may be used in the algorithm. The search enables optimization of the computations sharing, and it enables minimization of complexity. We define now a total order on S).

Take V, $U \in \Omega$ and write: $=\{1 \leq u_1 < u_2 < \ldots < u_a \leq w\}$ and $V=\{1 \leq v_1 < v_2 < \ldots < v_b \leq w\}$, then $U < V$ if either: i) a<b and $u=\{u_1, \ldots, u_a\}=\{v_1, \ldots, v_a\}$ or ii) for some $1 \leq i \leq \min(a,b)$ $v_i > u_i$ and $v_j = u_j$ for all $1 \leq j < i$.

The algorithm goes through every U element of $\Omega$ with accordance to the LEX order and computes for U the unique RRE form of $A_U$ called here $B_U$. When U has only one element, that is when, $U=\{j\}$ then the decoder only has to normalize $A_{\{j\}}$ so that leading element becomes 1 to obtain $B_{\{j\}}$. For $U=\{1 \leq u_1 < u_2 < \ldots < u_s \leq w\}$ $(1 < s \leq 2r)$ we define $U'=\{1 \leq u_1 < u_2 < \ldots < u_{s-1}\}$. In such case as mentioned above the running memory already has $B_{U'}$. Then by applying the algorithm of FIGS. 14A and 14B the decoder efficiently computes $B_U$. For s=2r, $x_U$ is equal to the last column of $B_U$ with 1 added at the end.

The second running memory is now presented for the case s=2r. It is assumed for j, $u_{s-1} < j \leq w$: $U_j=\{1 \leq u_1 < u_2 < \ldots < u_{s-1} < j \leq w\}$. When the processing of U begins the second memory comprises $h(x_{U(j)})$ for $u_{s-1} < j < u_s$. For $x \in F^{2r}$, h(x) is a fixed hash function that can be used. In an example, h(x) is fixed to be one of the symbols of x. This second memory is ordered lexicographically and therefore the complexity of inserting a new element into this memory is upper bounded by $\log_2(w)$ comparisons. When $h(x_U)$ is inserted to the second memory the said lexicographic order enables the decoder to know instantly if there is collision. In the case that a collision occurs, one proceeds as described above. The memory and a quick storage of the annihilator can be run in a compressed hashed form. Taken $U \in \Omega$ and when it is represented as $U=\{1 \leq u_1 < u_2 < \ldots < u_s \leq w\}$, $U^*[i]=\{1 < u_1 < u_2 < \ldots < u_i \leq w\}$ is defined for $1 \leq i < s$. When the algorithm starts the U-step, the first memory always includes $\tilde{U}=\{U^*[i]: 1 \leq i < s\}$ (e.g., typically in a compressed form). At this point, the decoder erases from the first memory every item (if exists) which is not in (the compressed form of) $\tilde{U}$. When the U step ends, then if $|U|<2r$, the decoder adds $B_U$ to the first memory.

An embodiment of the second memory with a specific hash is presented below. $1 \leq i^* \leq 2r$ is fixed and for $U \in \Omega$, with $|U|=2r$, $U=\{1 \leq u_1 < u_2 < \ldots < u_{2r} \leq w\}$ $y_U$ (the hash of $x_U$) is defined to be the i* symbol of $x_U$ and define for j, $u_{2r-1} < j \leq w$: $U(j)=\{1 \leq u_1 < u_2 < \ldots < u_{2r-1} < j \leq w\}$. When the algorithm starts the U-step, the second memory contains the list $L:=\{y_{U(j)}: u_{2r-1} < j \leq w\}$ ordered lexicographically. When the U-step ends, $y_U$ is inserted in this list with accordance to the lexicographic order. This provides an accurate and quick detection of collisions, that is, if $y_U = y_{U(j)}$ for some $u_{2r-1} < j \leq w$, then the insertion procedure detects it. In such event, there is "collision alarm" and the decoder checks if $x_U = x_{U(j)}$. If the answer is negative, then the above process continues as described. If the answer is positive, then it proceeds as discussed above where it states "it is assumed that a subset $U \subseteq [w]$ is written as an increasing sequence: $U = \{1 \leq u_1 < u_2 < \ldots < u_s \leq w\}$. $A_U$ is submatrix of A whose first row is the $u_1$ row of A and its second row is the $u_2$ row of A, etc.; the algorithm process every $A_U$ when U belongs to the following set: $\Omega = \{U \subseteq [w]: 1 \leq |U| \leq 2r-1, w-(2r-|U|+1) \geq \max(U)\} \cup \{U \subseteq [w]: |U| = 2r, |U \cap \{w-1, w\}| \leq 1\}$; and tt turns $A_U$ into RRE from written by $B_U$".

Next, the RS decoder 134 performs an interaction search on the result of the solution search (step S1107). The interaction search searches for intersections of size 2r, which is guaranteed to have 2r+1 erasures in W.

Lastly, the RS decoder 134 performs a Chien Search on the remaining polynomial solutions $\lambda(x)$ to find the error locations (step S1108). For example, the Chien Search may find t+r errors, such as $\deg(\lambda(x))=[J]$.

An error correction can then be performed on the symbols with the found error locations to generate corrected data, and the corrected data can be output to the Host 100.

Figure 15:
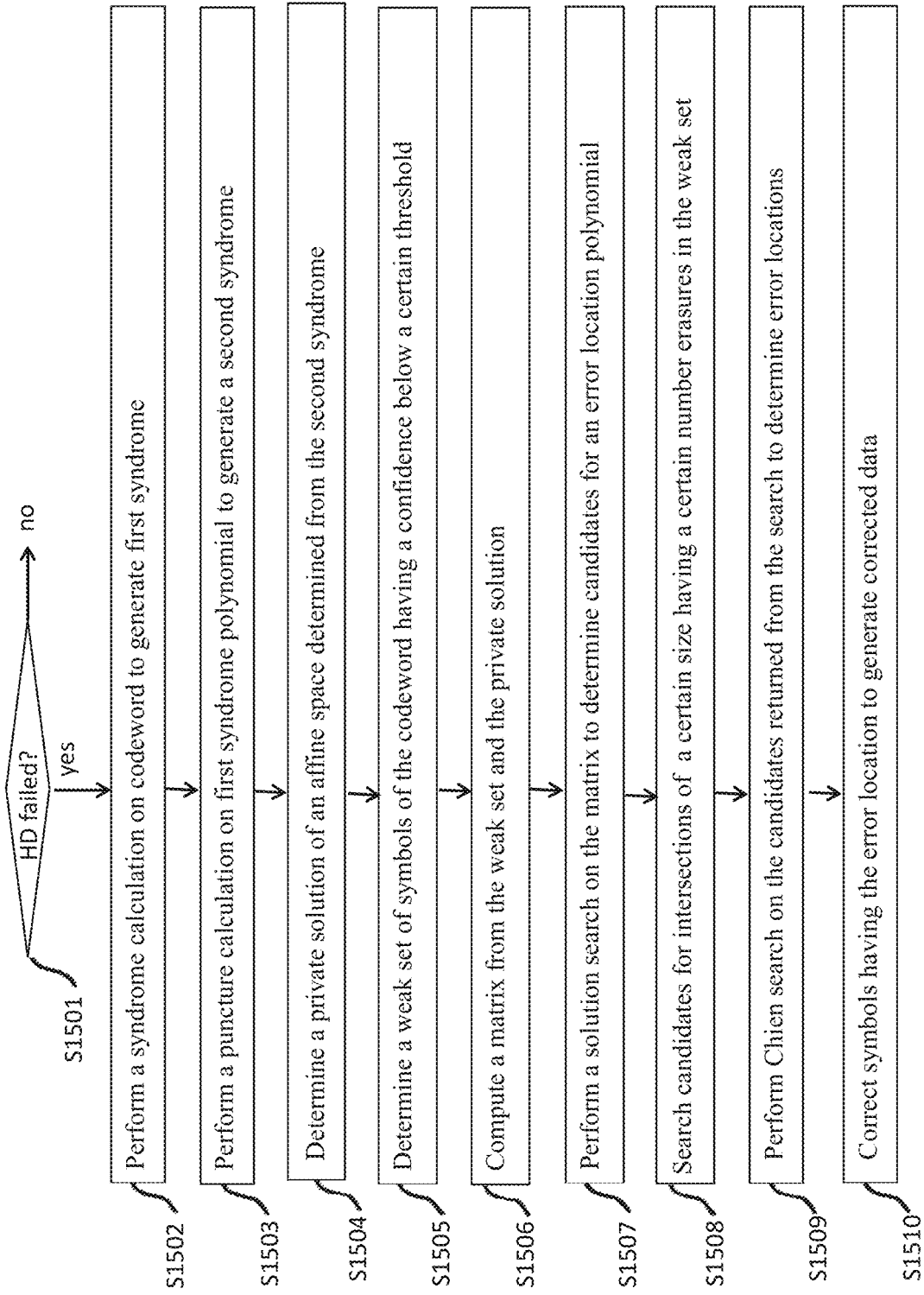
FIG. 15 illustrates a method of reading data according to an exemplary embodiment of the inventive concept.

FIG. 15 illustrates a method of reading data according to an exemplary embodiment of the inventive concept. The method includes reading data from memory. For example, the Host device 100 may send the memory controller 210 a read request including a read command and logical address of the memory device 220, where the data is read from a physical address of the memory device 220 associated with the logical address. For example, the mapping table MT may be accessed using the logical address to retrieve the physical address. The read data (e.g., a codeword) may be temporarily stored in the page buffer 130. The read of the data may be performed by the controller core 121.

The method may include performing a hard-decision decoding (HD) on the codeword (step S1501). If the hard-decision decoding is successful, the HD results in corrected data that can then be output to the Host 100.

If the hard-decision decoding fails, then the method of FIG. 15 performs a soft-decision decoding on the codeword (see steps S1502-S1510).

The soft-decision decoding includes performing a syndrome calculation on the codeword to generate a first syndrome polynomial (step S1502).

The soft-decision decoding further includes performing a puncture calculation on the first syndrome polynomial to generate a second syndrome polynomial (step 1503).

The soft-decision decoding further includes generating a private solution of an affine space determined from the second syndrome polynomial (step S1504).

The soft-decision decoding further includes determining a weak set of symbols of the codeword having a confidence below a certain threshold (step S1505).

The soft-decision decoding further includes computing a matrix from the weak set and the private solution (step S1506).

The soft-decision decoding further includes performing a solution search on the matrix to determine candidates of a certain size having a certain number of erasures in the weak set (step S1507).

The soft-decision decoding further includes searching the candidates for intersections of a certain size having a certain number of erases in the weak set (step S1508).

The soft-decision decoding further includes performing a Chien search on the candidates returned from the search to determine error locations (step S1509).

The soft-decision decoding further includes correcting symbols having the error locations to generate corrected data (step S1510).

The method may further include outputting the corrected data to the Host 100. For example, the controller core 121 may output the resulting data to the Host device 100.

Figure 16:
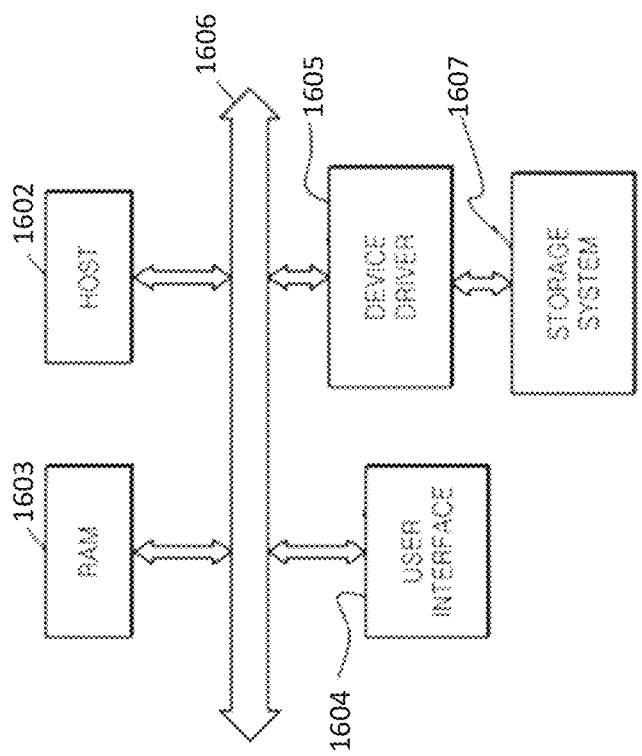
FIG. 16 is a block diagram of a computing system including a non-volatile memory system, according to an exemplary embodiment of the inventive concept.

FIG. 16 is a block diagram of a computing system 1200 including a non-volatile memory system, according to an exemplary embodiment of the inventive concept.

The non-volatile memory system in FIG. 16 may be the memory system 200 illustrated in FIG. 1. In the computing system, which may be, for example, a mobile device or a desktop computer, the non-volatile memory system may be mounted as a non-volatile storage system, however exemplary embodiments are not limited thereto.

The computing system may include, for example, a host 1602 including a CPU, a RAM 1603, a user interface 1604, and a device driver 1605. The host 1602 may be the host 100 illustrated in FIG. 1, and the device driver 1605 may be the memory device driver 111 illustrated in FIG. 1. These elements are electrically connected to a bus 1606. A non-volatile storage system 1607 may be connected to the device driver 1605. The host 1602 may control the entire computing system and perform an operation corresponding to a user command input through the user interface 1604. The RAM 1603 may function as a data memory of the host 1602. The host 1602 may write user data to or read user data from the non-volatile storage system 1607 through the device driver 1605. In FIG. 16, the device driver 1605 that controls the operation and management of the non-volatile storage system 1607 is illustrated as being disposed outside the host 1602, however exemplary embodiments are not limited thereto. For example, in an exemplary embodiment, the device driver 1605 may be disposed inside the host 1602.

In exemplary embodiments of the present inventive concept, a three-dimensional (3D) memory array is provided as the non-volatile storage system 1607 The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

Exemplary embodiments of the present invention may be embodied directly in hardware, in a software module executed by a processor, or in a combination of the two. A software module may be tangibly embodied on a non-transitory program storage device such as, for example, in RAM memory, flash memory, ROM memory, EPROM memory, EEPROM memory, registers, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an application specific integrated circuit (ASIC).

An example of decoding a received word according to an embodiment of the inventive concept is explained below. A codeword is first transmitted through a channel, and a word received in response to the transmission of the codeword. The channel may be a memory device (e.g., 220) including a plurality of memory cells. For example, the channel may include a line between the memory device 220 and the controller core 121 that includes the memory interface block 126. The channel may also be a line between the host and the controller core 121 that includes the host interface block 125. In the received word there may be some symbols that are erased and some symbols that have errors, while the rest of the symbols are unchanged. The decoder (e.g., 134) knows or can determine the locations of the erased symbols (i.e., the erasures). The decoder may place a zero at each erase symbol within the received word to generate a modified word. For example, if each symbol is 8 bits, and the decoder determines the first symbol was erased, the decoder could insert 8 zeros at the beginning of the received word.

The decoder computes a first syndrome polynomial in accordance with the modified received word, and next the decoder computes a second syndrome polynomial by multiplying the first syndrome polynomial by a locator polynomial which is based on the location of the erasures. The second syndrome polynomial is equal to a syndrome resulting from the received word by puncturing a code at coordinates of the erasures.

The decoder finds a basis and a private solution to an affine space V of polynomials that solve key equations based on the second syndrome polynomial. A first coefficient of every polynomial in V is one, and its degree does not exceed a maximal number of errors solvable by the decoder.

The decoder determines a weak set of locations of symbols in the received word with confidence below a certain confidence level (i.e., with low confidence).

The decoder computes a matrix A from the basis, the private solution, and the weak set. For example, a value at every entry in the matrix A that is not in the last column is an evaluation of a polynomial from the basis of a symbol of the weak set, and a value at every entry in the matrix that is in the last column is an evaluation of the private solution of a symbol of the weak set.

The decoder then finds sub-matrices (e.g., square sub-matrices) of the matrix A whose rank is equal to a rank of the matrix, and then determines error location polynomial (ELP) candidates from the sub-matrices, the basis and the private solution. The sub-matrices may be those in which the last column is a unique linear combination of the preceding columns. The decoder may use coefficients of each linear combination to combine the basis and the private solution into a corresponding ELP candidate. The ELP candidates may be determined by solving linear equations where a solution is performed with computation sharing where at each iteration, the submatrices that have more columns than rows, are converted into a Reduced Row Echelon form, and this computation is based on computations done in former iterations.

The optimal ELP is then selected (e.g., by performing a Chien Search) from among the ELP candidates, and then the received word is corrected using the optimal ELP. The optimal ELP could instead be selected by performing Gaussian elimination operations on subsets of rows of the matrix A, where computation sharing is frequently used. The optimal ELP may be determined by processing and storing a plurality of matrices in temporary storage, where each of the matrices has a first property that all rows consisting of only zeroes are at the bottom; a second property that a leading coefficient of a non-zero row is always strictly to the right of a leading coefficient of a row above the non-zero row; a third property that a leading entry in each non-zero row is a one and referred to as a leading 1; a fourth property that each column containing the leading 1 has zeros in all its other entries; and a fifth property that a linear space spanned by its rows is equal to a linear space spanned by a subset of rows of the matrix. An iterative process may be used to determine the optimal ELP. An input of each iteration of the iterative process comprises a second matrix B with the five properties and a row v of the matrix A, and wherein said iteration comprises Gaussian elimination operations that are performed on matrix B and v, and wherein an output of said iteration comprises a matrix with the five properties, whose rows span the linear space that is equal to the linear space spanned by the rows of B and v. A depth first tree may be used to determine B and v.

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A memory system, comprising:
a memory device comprising a plurality of memory cells; and
a decoder configured to perform a soft-decision decoding by computing a first syndrome polynomial in accordance with a received word, computing a second syndrome polynomial by multiplying the first syndrome polynomial by a locator polynomial based on locations of erasures within the received word, finding a basis and private solution to an affine space of polynomials that solve key equations based on the second syndrome polynomial, determining a weak set of a locations of symbols in the received word with confidence below a certain confidence level, computing a matrix A from the basis, the private solution and the weak set, determining sub-matrices in the matrix A whose rank is equal to a rank of the matrix A, determining error locator polynomial (ELP) candidates from the sub-matrices, the basis, and the private solution, and correcting the received word using a selected one of the ELP candidates to generate corrected data.

2. The memory system of claim 1, wherein the selected ELP candidate is determined by performing a Chien search on the ELP candidates.

3. The memory system of claim 1, wherein the selected ELP candidate is determined by performing Gaussian elimination operations on subsets of rows of the matrix A, where computation sharing is frequently used.

4. The memory system of claim 1, wherein the selected ELP candidate is determined by processing and storing a plurality of matrices in temporary storage, where each of the matrices comprise:
  a first property that all rows consisting of only zeroes are at the bottom;
  a second property that a leading coefficient of a non-zero row is always strictly to the right of a leading coefficient of a row above the non-zero row;
  a third property that a leading entry in each non-zero row is a one and referred to as a leading 1;
  a fourth property that each column containing the leading 1 has zeros in all its other entries; and
  a fifth property that a linear space spanned by its rows is equal to a linear space spanned by a subset of rows of the matrix A.

5. The memory system of claim 4, wherein an iterative process is used and an input of each iteration of the iterative process comprises a matrix B with the five properties and a row v of the matrix A, and wherein said iteration comprises Gaussian elimination operations that are performed on matrix B and v, and wherein an output of said iteration comprises a matrix with the five properties, whose rows span the linear space that is equal to the linear space spanned by the rows of B and v.

6. The memory system of claim 5, wherein a depth first tree determines B and v.

7. The memory system of claim 1, wherein the decoder performs the soft-decision decoding on the received word in response to receiving a read request from a host device and reading the word from the memory device based on the read request.

8. The memory system of claim 7, wherein a memory controller of the memory system outputs the corrected data to the host device.

9. The memory system of claim 1, wherein the decoder only performs the soft-decision decoding after a hard-decision decoding on the received word fails.

10. The memory system of claim 1, wherein prior to computing the first syndrome polynomial, the decoder determines the erasures in the received word and places a 0 in the received word at a location of each of the determined erasures.

11. The memory system of claim 1, wherein the second syndrome polynomial is equal to a syndrome resulting from the received word by puncturing a code at coordinates of the erasures.

12. The memory system of claim 1, wherein a first coefficient of every polynomial in the affine space is 1 and a degree of every polynomial in the affine space does not exceed a maximal number of errors solvable by the decoder.

13. The memory system of claim 1, wherein a value at every entry in the matrix that is not in a last column is an evaluation of a polynomial from the basis of a symbol of the weak set, and a value at every entry in the matrix that is in the last column is an evaluation of the private solution of a symbol of the weak set.

14. The memory system of claim 1, wherein the affine space is determined by using by-products of a Berlekamp-Massey (BM) algorithm applied to the received word.

15. A computer-implemented method for decoding a received word, the method comprising:
  computing, by a decoder of a memory system, a first syndrome polynomial in accordance with the received word;
  computing, by the decoder, a second syndrome polynomial by multiplying the first syndrome polynomial by a locator polynomial based on locations of erasures within the received word, wherein the second syndrome polynomial is a polynomial whose coefficients are a subset of coefficients of a result of the multiplying;
  finding, by the decoder, a basis and private solution to an affine space of polynomials that solve key equations based on the second syndrome polynomial;
  determining, by the decoder, a weak set of a locations of symbols in the received word with confidence below a certain confidence level;
  computing, by the decoder, a matrix from the basis, the private solution and the weak set;
  determining, by the decoder, sub-matrices in the matrix whose rank is equal to a rank of the matrix;
  determining, by the decoder, error locator polynomial (ELP) candidates from the sub-matrices, the basis, and the private solution; and
  correcting, by the decoder, the received word using a selected one of the ELP candidates to generate corrected data.

16. The computer-implemented method of claim 15, wherein the selected ELP candidate is determined by performing a Chien search on the ELP candidates.

17. The computer-implemented method of claim 15, wherein the decoding is performed on the received word in response to receiving a read request from a host device and reading the word from a memory device of the memory system based on the read request.

18. The computer-implemented method of claim 17, further comprising outputting the corrected data to the host device.

19. The computer-implemented method of claim 17, wherein the decoding is only performed after a hard-decision decoding on the received word fails.

20. The computer-implemented method of claim 15, wherein prior to the computing of the first syndrome polynomial, the method further comprises determining the erasures in the received word and placing a 0 in the received word at a location of each of the determined erasures.

* * * * *